(12) United States Patent
Niisoe

(10) Patent No.: US 7,005,364 B2
(45) Date of Patent: Feb. 28, 2006

(54) METHOD FOR MANUFACTURING SEMICONDUCTOR DEVICE

(75) Inventor: Naoto Niisoe, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 181 days.

(21) Appl. No.: 10/750,359

(22) Filed: Dec. 29, 2003

(65) Prior Publication Data

US 2005/0095824 A1  May 5, 2005

(30) Foreign Application Priority Data

Jan. 8, 2003 (JP) .............................. 2003-002553

(51) Int. Cl.
*H01L 21/425* (2006.01)

(52) U.S. Cl. .................... 438/514; 438/510; 438/517; 438/519; 438/521; 438/524; 438/527; 438/542; 438/546; 438/547; 438/548; 438/561

(58) Field of Classification Search ............... 438/519, 438/521, 523, 531, 556, 561, 514
See application file for complete search history.

(56) References Cited

U.S. PATENT DOCUMENTS

| | | | | |
|---|---|---|---|---|
| 5,278,082 A | * | 1/1994 | Kawamura | 438/286 |
| 5,538,913 A | * | 7/1996 | Hong | 438/282 |
| 6,522,003 B1 | * | 2/2003 | Minami et al. | 257/758 |
| 6,656,800 B1 | * | 12/2003 | Arai | 438/275 |
| 6,740,551 B1 | * | 5/2004 | Yoshida et al. | 438/199 |
| 6,747,319 B1 | * | 6/2004 | Kojima et al. | 257/369 |
| 2002/0011630 A1 | * | 1/2002 | Imoto | 257/375 |
| 2003/0054594 A1 | * | 3/2003 | Yoshida et al. | 438/154 |

FOREIGN PATENT DOCUMENTS

| | | |
|---|---|---|
| JP | 59-229876 | * 12/1984 |
| JP | 8-107064 | 4/1996 |
| JP | 11-40495 | 2/1999 |

* cited by examiner

*Primary Examiner*—B. William Baumeister
*Assistant Examiner*—Granvill D. Lee, Jr.
(74) *Attorney, Agent, or Firm*—Hamre, Schumann, Mueller & Larson, P.C.

(57) ABSTRACT

The invention provides a method for manufacturing a semiconductor device with which an impurity introduction region and a positioning mark region can be formed aligned, based on a common insulating film pattern. The method for manufacturing a semiconductor device includes an insulating film pattern formation step; a first photosensitive pattern formation step of forming, on the insulating film pattern, a first photosensitive pattern with an aperture that exposes a positioning mark region, the first photosensitive pattern covering an impurity introduction region; a level difference formation step of forming in the semiconductor substrate, at the aperture formed in the insulating film pattern, a level difference for adjusting a position of the photomask at the positioning mark region; a first photosensitive pattern removal step of removing the first photosensitive pattern; and an impurity introduction step of introducing the impurities through the aperture formed in the insulating film pattern into the impurity introduction region.

5 Claims, 14 Drawing Sheets

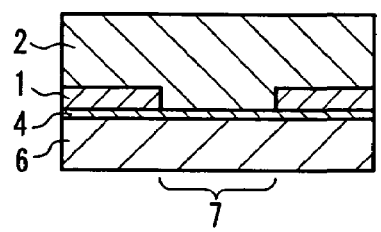
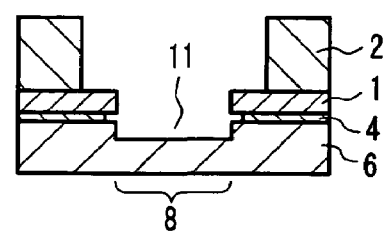
FIG. 2A
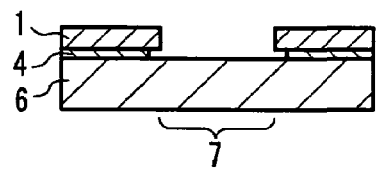
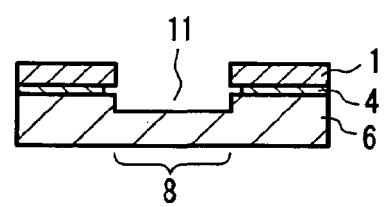
FIG. 2B
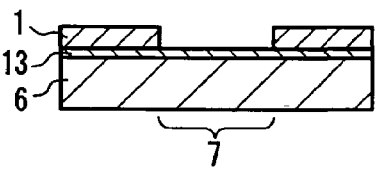
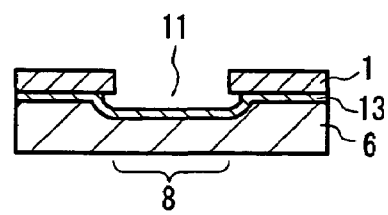
FIG. 2C
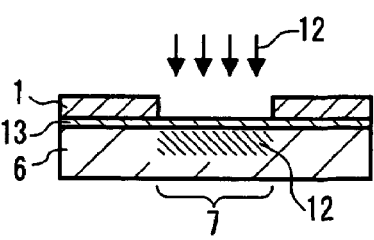
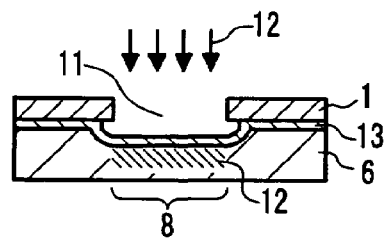
FIG. 2D
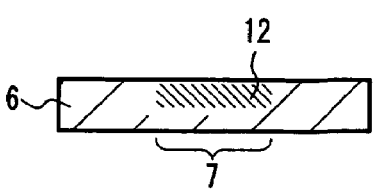
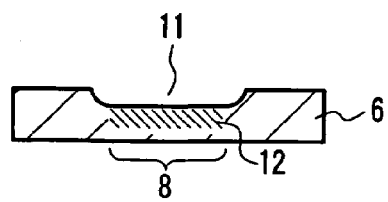
FIG. 2E FIG. 4A 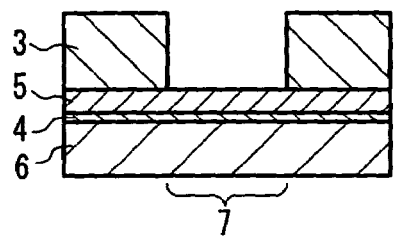 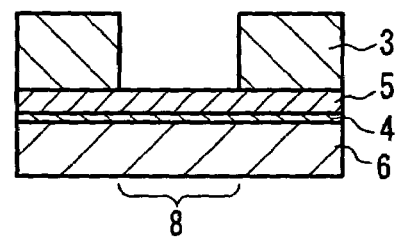
FIG. 4B 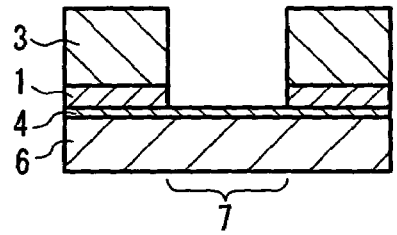 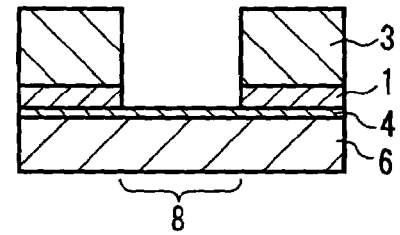
FIG. 4C 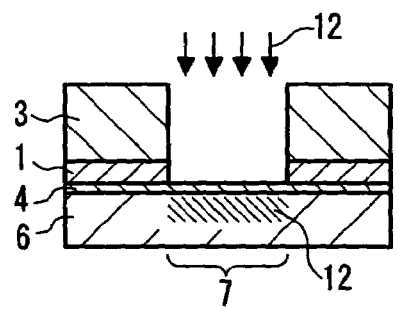 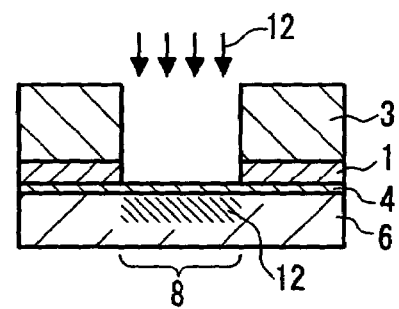
FIG. 4D 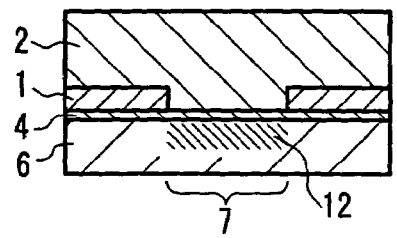 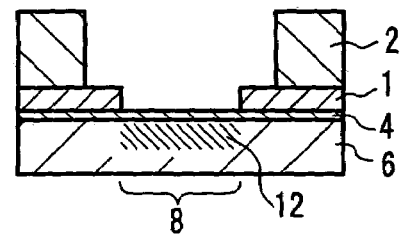

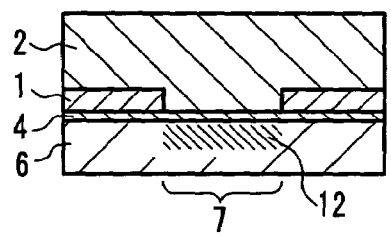
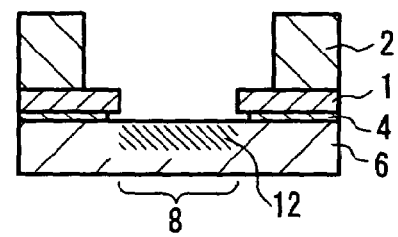
FIG. 5A
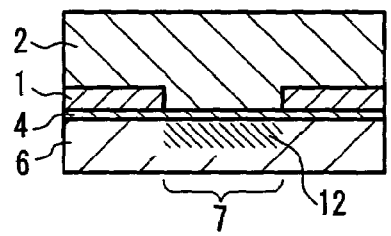
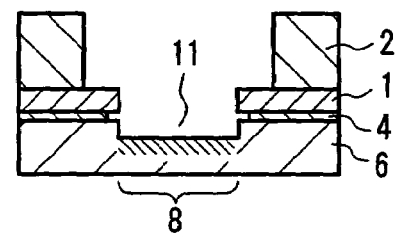
FIG. 5B
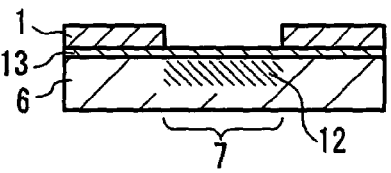
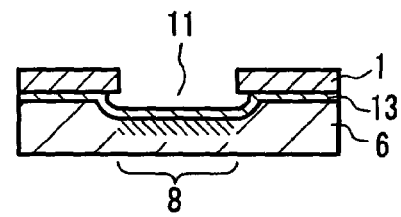
FIG. 5C
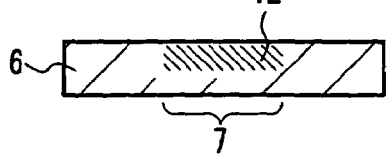
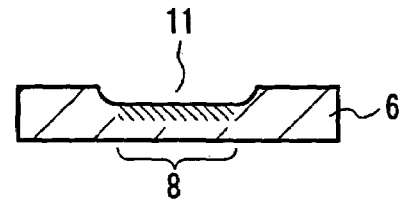
FIG. 5D FIG. 6A 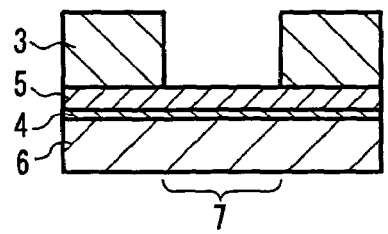 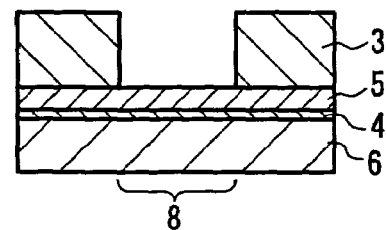
FIG. 6B 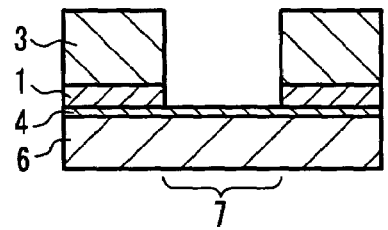 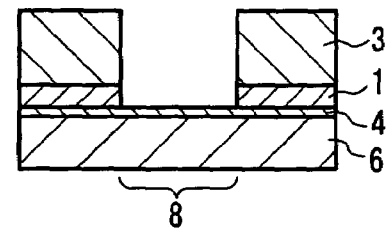
FIG. 6C 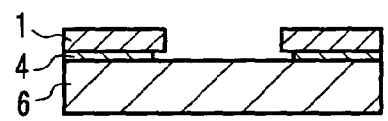 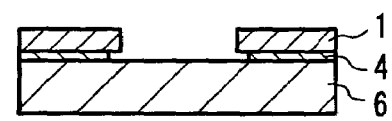
FIG. 6D 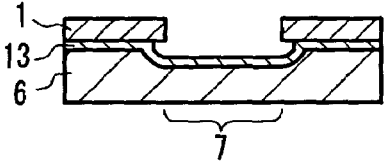 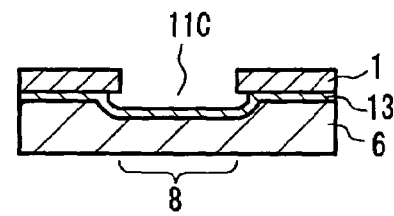
FIG. 6E 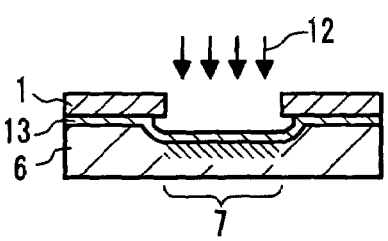 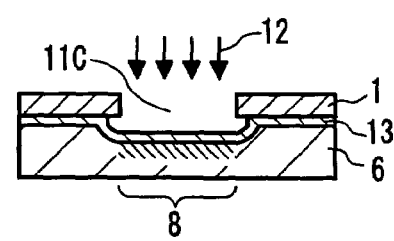
FIG. 6F 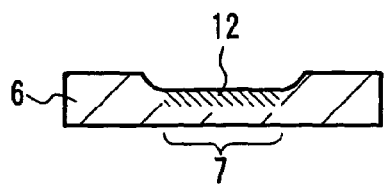 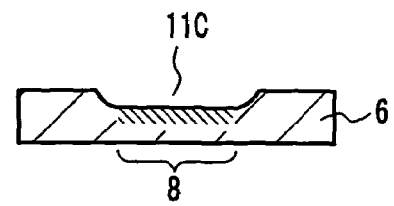

FIG. 8A 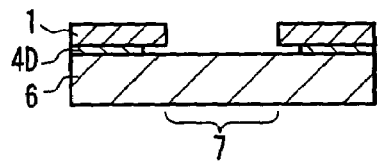 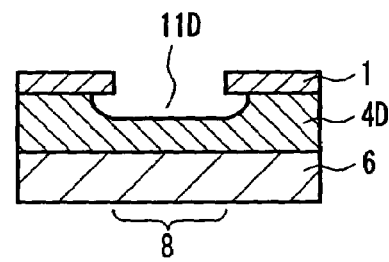
FIG. 8B 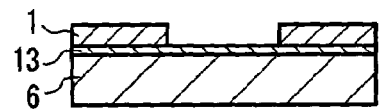 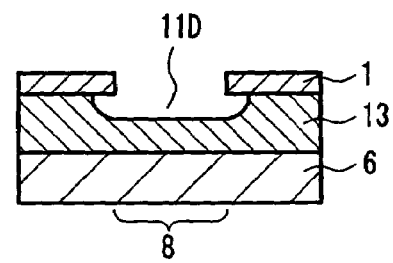
FIG. 8C 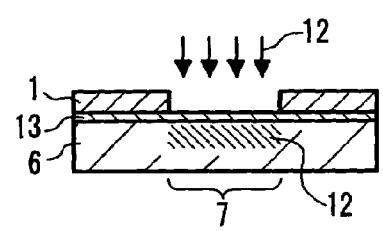 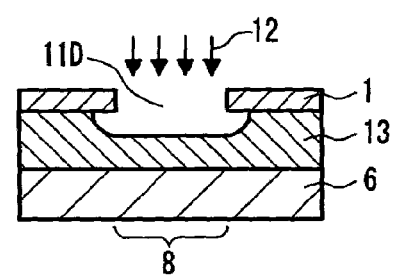
FIG. 8D 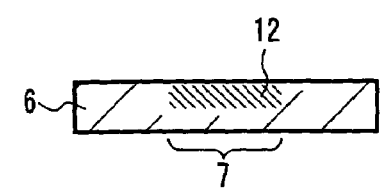 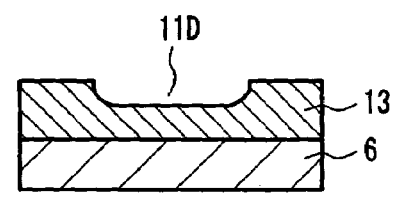

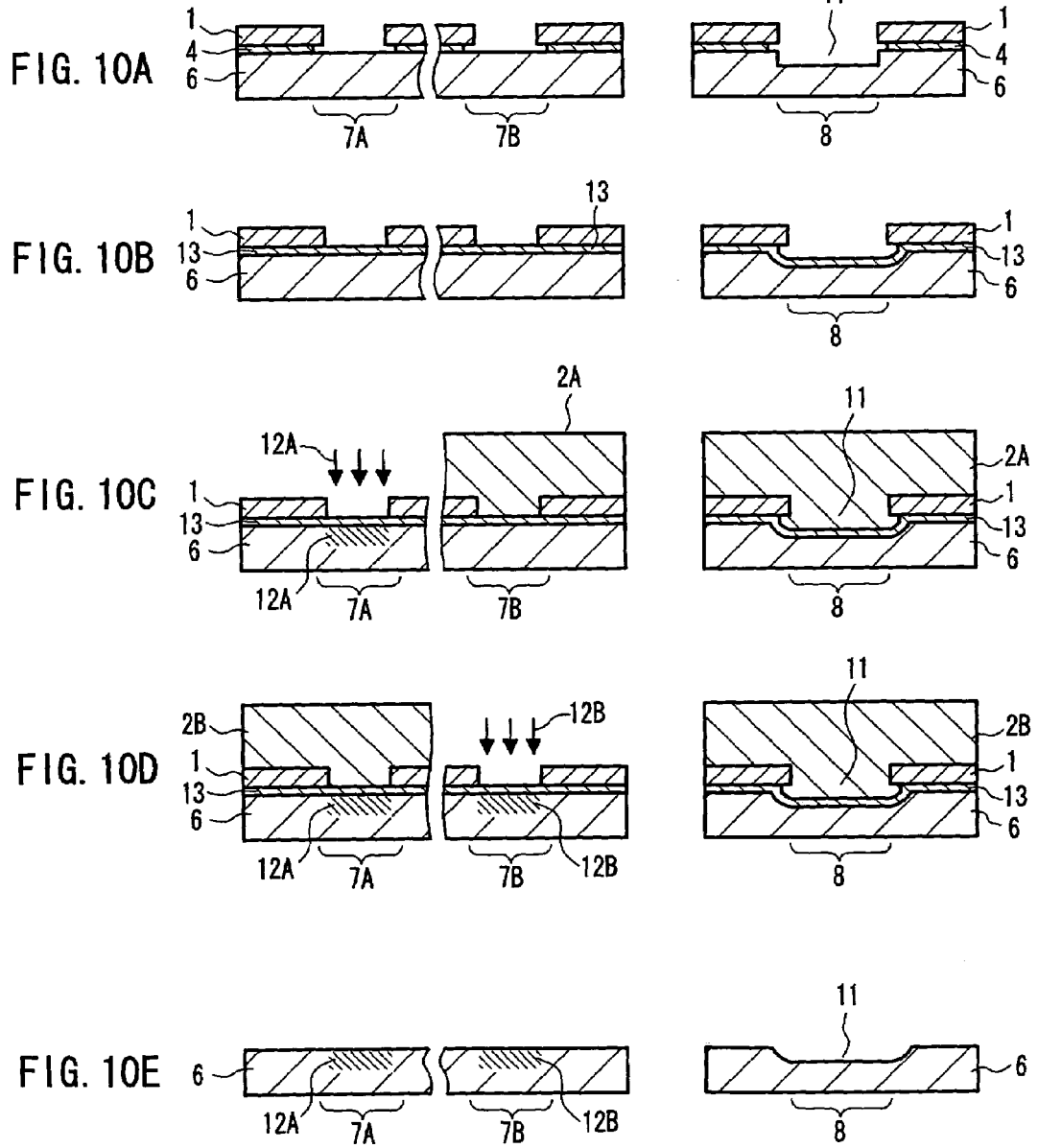

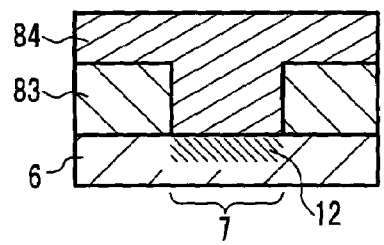
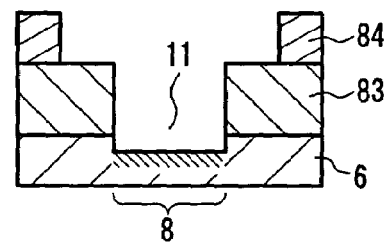
FIG. 14A PRIOR ART
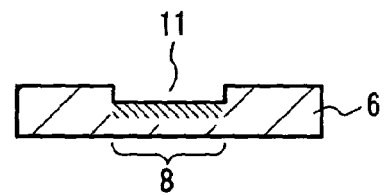
FIG. 14B PRIOR ART

METHOD FOR MANUFACTURING SEMICONDUCTOR DEVICE

FIELD OF THE INVENTION

The present invention relates to methods for manufacturing a semiconductor device including a step of forming, on a semiconductor substrate, a level difference for adjusting the position of a photomask and a step of introducing impurities into an impurity introduction region of the semiconductor substrate.

BACKGROUND OF THE INVENTION

Lithography steps for transferring a circuit pattern onto a silicon substrate include a film forming step of applying a photosensitive material onto a silicon substrate and drying it, a step of overlaying a photomask on an overlaid region based on a positioning mark, a step of exposing the photosensitive film by irradiating light, an electron beam or X-rays through the photomask onto the photosensitive film, and a step of removing the photosensitive material at the portions where it is not needed after the exposure, thus forming a pattern of photosensitive material on the silicon substrate. Thus, a step of overlaying a photomask is performed when forming a semiconductor device.

FIGS. 11A to 11D are cross-sectional views illustrating a conventional method for manufacturing a semiconductor device. As shown in FIG. 11A, a photosensitive pattern 93 with an aperture at a portion corresponding to a positioning mark region 8 for the photomask is formed on a semiconductor substrate 6.

As shown in FIG. 11B, in order to form the positioning mark for the photomask, the semiconductor substrate 6 in the positioning mark region 8 is etched at the aperture in the photosensitive pattern 93, thus forming a level difference 11.

Then, after removing the photosensitive pattern 93 by washing or the like, a photosensitive pattern 92 having an aperture at an impurity introduction region 7 is formed covering the level difference 11 formed at the positioning mark region 8, as shown in FIG. 11C. The overlaying of the photomask for forming the photosensitive pattern 92 is carried out with reference to the positioning mark formed by the above-noted photosensitive pattern 93. Then, impurities 12 are introduced by ion implantation or the like into the impurity introduction region 7 of the semiconductor substrate 6 through the aperture of the photosensitive pattern 92.

As shown in FIG. 11D, the photosensitive pattern 92 is removed by washing or the like, thus obtaining the impurity introduction region 7 into which impurities 12 have been introduced and the positioning mark region 8 in which the level difference 11 for the positioning mark is formed.

However, in this conventional method for manufacturing a semiconductor device as shown in FIGS. 11A–11D, in addition to forming the photosensitive pattern 92 for introducing impurities 12 into the impurity introduction region 7, it is necessary to form a separate photosensitive pattern 93 for forming the level difference 11 of the positioning mark for the photomask. Therefore, there is the problem that the number of manufacturing steps increases.

Moreover, photomasks forming other impurity introduction regions for introducing other impurities and gate electrodes are positioned with reference to the level difference 11 of the positioning mark formed by the photosensitive pattern 93, so that there is a risk of misalignments to the impurity introduction region 7 formed by the photosensitive pattern 92, which is different from the photosensitive pattern 93. Therefore, there is the problem that the characteristics of the semiconductor device may deteriorate.

In order to solve this problem, JP H08-107064A discloses a method for forming an impurity introduction region and a level difference for a positioning mark using the same photosensitive material. FIGS. 12A to 12D are cross-sectional views illustrating this other conventional method for manufacturing a semiconductor device.

As shown in FIG. 12A, a photosensitive pattern 83 having apertures at a portion corresponding to the positioning mark region 8 for the photomask and at a portion corresponding to an impurity introduction region 7 is formed on the semiconductor substrate 6. Then, as shown in FIG. 12B, the semiconductor substrate 6 is etched in the positioning mark region 8 and the impurity introduction region 7 at the apertures in the photosensitive pattern 83, forming a level difference 11 and a level difference 81.

Next, as shown in FIG. 12C, impurities 12 are introduced by ion implantation or the like through the apertures in the photosensitive pattern 83 into the impurity introduction region 7 and the positioning mark region 8 in the semiconductor substrate 6.

After that, as shown in FIG. 12D, the photosensitive pattern 83 is removed by washing or the like, obtaining the impurity introduction region 7 into which impurities 12 have been introduced and the positioning mark region 8 in which the level difference 11 for the positioning mark is formed.

However, with this method, the semiconductor substrate 6 is also etched in the impurity introduction region 7, so that crystal defects in the semiconductor substrate 6 result due to the plasma damage when etching. For this reason, there is the problem that the characteristics of the semiconductor device may deteriorate due to leak currents.

Moreover, since the impurities 12 are ion implanted directly after dry etching without performing a washing step, the ions are implanted from above the particles that are formed during the etching. This leads to crystal defects in the semiconductor substrate 6. As a result, there is the problem that the characteristics of the semiconductor device may deteriorate due to leak currents.

Furthermore, the reaction products formed during the etching act as a mask during the ion implantation, so that there is the risk that the desired concentration is not attained in the formed impurity region.

In order to solve these problems, JP H11-40495A discloses a method of forming a photosensitive pattern on a silicon substrate, lowering the photosensitivity of the formed photosensitive pattern by a heating process, introducing impurities to apertures in a predetermined region formed by the photosensitive pattern, forming another photosensitive pattern with apertures that are larger than the apertures in the first photosensitive pattern, and forming the positioning mark by etching.

FIGS. 13A to 13D, 14A and 14B are cross-sectional views illustrating yet another conventional method for manufacturing a semiconductor device.

As shown in FIG. 13A, a photosensitive pattern 83 with apertures at a portion corresponding to a positioning mark region 8 for the photomask and an impurity region 7 is formed on a semiconductor substrate 6.

Then, as shown in FIG. 13B, impurities 12 are introduced by ion implantation or the like through the apertures of the photosensitive pattern 83 into the impurity region 7 and the positioning mark region 8 in the semiconductor substrate 6.

Next, as shown in FIG. 13C, the photosensitive pattern 83 is subjected to a heating process, in order to lower the photosensitivity of the photosensitive pattern 83. After that, as shown in FIG. 13D, a photosensitive pattern 84 with an aperture in the positioning mark region 8 that is larger than the aperture of the photosensitive pattern 83 is formed on the photosensitive pattern 83, covering the impurity introduction region 7.

Then, as shown in FIG. 14A, the semiconductor substrate 6 is etched at the aperture of the photosensitive pattern 83 in the positioning mark region 8, forming a level difference 11 for the positioning mark. Next, as shown in FIG. 14B, the photosensitive pattern 84 and the photosensitive pattern 83 are removed by washing or the like, thus obtaining the impurity introduction region 7 into which impurities 12 have been introduced and the positioning mark region 8 in which the level difference 11 for the positioning mark is formed.

However, with this method, when there are pattern defects such as misalignments or deviations from the specifications of the dimensions, then it is not possible to remove only the photosensitive pattern 84 by washing or the like, so that there is the problem that pattern reproduction is not possible.

Moreover, when a photosensitive pattern 84 made of the same material as the photosensitive pattern 83 is applied on top of the photosensitive pattern 83, there is problem that the photosensitive pattern 84 may be destroyed as a result of mixing between the photosensitive pattern 83 and the photosensitive pattern 84.

It is an object of the present invention to provide a method for manufacturing a semiconductor device, with which an impurity introduction region and a positioning mark region that are aligned with one another can be formed, based on a common insulating film pattern and without inviting deterioration of the semiconductor device characteristics.

SUMMARY OF THE INVENTION

A method for manufacturing a semiconductor device according to one aspect of the present invention includes an insulating film pattern formation step of forming, on a semiconductor substrate, an insulating film pattern with an aperture at an impurity introduction region for introducing impurities into the semiconductor substrate and an aperture at a positioning mark region for adjusting a position of a photomask with respect to the semiconductor substrate; a first photosensitive pattern formation step of forming, on the insulating film pattern, a first photosensitive pattern with an aperture that exposes the positioning mark region, the first photosensitive pattern covering the impurity introduction region; a level difference formation step of forming, at the positioning mark region in the semiconductor substrate, a level difference for adjusting the position of the photomask at the aperture formed in the insulating film pattern; after the level difference formation step, a first photosensitive pattern removal step of removing the first photosensitive pattern; and after the first photosensitive pattern removal step, an impurity introduction step of introducing the impurities into the impurity introduction region through the apertures formed in the insulating film pattern at the impurity introduction region of the semiconductor substrate.

A method for manufacturing a semiconductor device according to another aspect of the present invention includes an insulating film pattern formation step of forming, on a semiconductor substrate, an insulating film pattern with an aperture at an impurity introduction region for introducing impurities into the semiconductor substrate and an aperture at a positioning mark region for adjusting a position of a photomask with respect to the semiconductor substrate; an impurity introduction step of introducing the impurities into the impurity introduction region through the apertures formed in the insulating film pattern at the impurity introduction region of the semiconductor substrate; after the impurity introduction step, a first photosensitive pattern formation step of forming, on the insulating film pattern, a first photosensitive pattern with an aperture that exposes the positioning mark region, the first photosensitive pattern covering the impurity introduction region; after the first photosensitive pattern formation step, a level difference formation step of forming, at the positioning mark region in the semiconductor substrate, a level difference for adjusting the position of the photomask at the aperture formed in the insulating film pattern; and after the level difference formation step, a first photosensitive pattern removal step of removing the first photosensitive pattern.

A method for manufacturing a semiconductor device according to yet another aspect of the present invention includes an insulating film pattern formation step of forming, on a semiconductor substrate, an insulating film pattern with an aperture at an impurity introduction region for introducing impurities into the semiconductor substrate and an aperture at a positioning mark region for adjusting a position of a photomask with respect to the semiconductor substrate; a level difference formation step of forming, by thermal oxidation of the semiconductor substrate at the positioning mark region, a level difference for adjusting a position of the photomask at the apertures formed in the insulating film pattern; and after the level difference formation step, an impurity introduction step of introducing the impurities into the impurity introduction region through the apertures formed in the insulating film pattern at the impurity introduction region of the semiconductor substrate.

A method for manufacturing a semiconductor device according to yet another aspect of the present invention includes a first insulating film formation step of forming a first insulating film on the semiconductor substrate; an insulating film pattern formation step of forming, on the first insulating film, an insulating film pattern with an aperture at an impurity introduction region for introducing impurities into the semiconductor substrate and an aperture at a positioning mark region for adjusting a position of a photomask with respect to the semiconductor substrate; a level difference formation step of forming, by etching the first insulating film at the positioning mark region, a level difference for adjusting the position of the photomask at the apertures formed in the insulating film pattern; and after the level difference formation step, an impurity introduction step of introducing the impurities into the impurity introduction region through the apertures formed in the insulating film pattern at the impurity introduction region of the semiconductor substrate.

A method for manufacturing a semiconductor device according to yet another aspect of the present invention includes an insulating film pattern formation step of forming, on a semiconductor substrate, an insulating film pattern with an aperture at a first impurity introduction region for introducing first impurities into the semiconductor substrate, an aperture at a second impurity introduction region for introducing second impurities into the semiconductor substrate, and an aperture at a positioning mark region for adjusting a position of a photomask with respect to the semiconductor substrate; a first photosensitive pattern formation step of forming, on the insulating film pattern, a first photosensitive pattern with an aperture that exposes the positioning mark region, the first photosensitive pattern covering the first impurity introduction region and the second impurity introduction region; a level difference formation step of forming, at the positioning mark region in the semiconductor substrate, a level difference for adjusting the position of the photomask at the aperture formed in the insulating film pattern; after the level difference formation step, a first photosensitive pattern removal step of removing the first photosensitive pattern; after the first photosensitive pattern removal step, a second photosensitive pattern formation step of forming, on the insulating film pattern, a second photosensitive pattern with an aperture that exposes the first impurity introduction region, the second photosensitive pattern covering the positioning mark region and the second impurity introduction region; a first impurity introduction step of introducing first impurities into the first impurity introduction region through the aperture formed in the insulating film pattern at the first impurity introduction region of the semiconductor substrate; after the first impurity introduction step, a second photosensitive pattern removal step of removing the second photosensitive pattern; after the second photosensitive pattern removal step, a third photosensitive pattern formation step of forming, on the insulating film pattern, a third photosensitive pattern with an aperture that exposes the second impurity introduction region, the third photosensitive pattern covering the positioning mark region and the first impurity introduction region; and a second impurity introduction step of introducing second impurities into the second impurity introduction region through the aperture formed in the insulating film pattern at the second impurity introduction region of the semiconductor substrate.

BRIEF DESCRIPTION OF THE DRAWINGS

FIGS. 2A to 2E are cross-sectional views illustrating the method for manufacturing a semiconductor device according to Embodiment 1.

FIGS. 4A to 4D are cross-sectional views illustrating a method for manufacturing a semiconductor device according to Embodiment 2.

FIGS. 5A to 5D are cross-sectional views illustrating the method for manufacturing a semiconductor device according to Embodiment 2.

FIGS. 6A to 6F are cross-sectional views illustrating a method for manufacturing a semiconductor device according to Embodiment 3.

FIGS. 8A to 8D are cross-sectional views illustrating the method for manufacturing a semiconductor device according to Embodiment 4.

FIGS. 10A to 10D are cross-sectional views illustrating the method for manufacturing a semiconductor device according to Embodiment 5.

FIGS. 14A and 14B are cross-sectional views illustrating an other conventional method for manufacturing a semiconductor device.

DESCRIPTION OF THE PREFERRED EMBODIMENTS

Figure 1A:
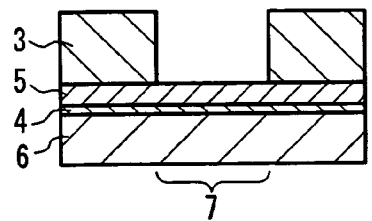
FIGS. 1A to 1D are cross-sectional views illustrating a method for manufacturing a semiconductor device according to Embodiment 1.

A method for manufacturing a semiconductor device according to an aspect of the present embodiments includes: a first photosensitive pattern formation step of forming, on an insulating film pattern, a first photosensitive pattern with an aperture that exposes a positioning mark region, the first photosensitive pattern covering an impurity introduction region; and a level difference formation step of forming, at the positioning mark region in the semiconductor substrate, a level difference for adjusting the position of the photomask at the aperture formed in the insulating film pattern. Therefore, the impurity introduction region that is covered by the first photosensitive pattern is not affected by the etching for forming the level difference for adjusting the position of the photomask. Consequently, the impurity introduction region is not etched. As a result, it is possible to form an impurity introduction region and a positioning mark region that are aligned, based on a common insulating film pattern, without inviting deterioration of the semiconductor device characteristics.

In this embodiment, it is preferable further to include a step of forming a first insulating film and a second insulating film, in that order, on the semiconductor substrate; and a step of forming, on the second insulating film, a second photosensitive pattern having an aperture at the impurity introduction region and an aperture at the positioning mark region; and that the insulating film pattern formation step forms the insulating film pattern by etching the second insulating film with the second photosensitive pattern as a mask.

It is preferable further to include a step of removing the second photosensitive pattern after the insulating film pattern formation step and before the first photosensitive pattern formation step.

It is preferable that the aperture in the first photosensitive pattern exposing the positioning mark region is larger than the aperture in the insulating film pattern formed at the positioning mark region.

It is preferable that in the level difference formation step, the level difference is formed by wet etching.

It is preferable that the depth of the level difference formed in the level difference formation step is at least 80 nanometer and at most 120 nanometer.

It is preferable that the depth of the level difference formed in the level difference formation step is 100 nanometer.

It is preferable to further include, before the insulating film formation step, a step of forming a first insulating film and a second insulating film, in that order, on the semiconductor substrate; and, after the first photosensitive pattern removal step, a first insulating film removal step of removing the first insulating film such that the impurity introduction region at the semiconductor substrate is exposed.

It is preferable that in the first insulating film removal step, the first insulating film is removed by wet etching.

It is preferable that in the impurity introduction step, boron is introduced into the impurity introduction region by ion implantation.

It is preferable that, after the impurity introduction step, a further step is included in which the insulating film pattern is removed by etching.

It is preferable that after the first photosensitive pattern removal step, a further step is included in which a thermal oxide film for protecting the surface of the semiconductor substrate into which the impurities are introduced is formed, and in the impurity introduction step, the impurities are introduced from above the thermal oxide film.

It is preferable that the film thickness of the thermal oxide film is at least 5 nanometer and at most 20 nanometer.

A method for manufacturing a semiconductor device according to another aspect of the present embodiment includes: after the impurity introduction step, a first photosensitive pattern formation step of forming, on the insulating film pattern, a first photosensitive pattern with an aperture that exposes the positioning mark region, the first photosensitive pattern covering the impurity introduction region; and after the first photosensitive pattern formation step, a level difference formation step of forming, at the positioning mark region in the semiconductor substrate, a level difference for adjusting the position of the photomask at the aperture formed in the insulating film pattern. Therefore, the impurity introduction region covered by the first photosensitive pattern is not affected by the etching for forming the level difference for adjusting the position of the photomask. Consequently, the impurity introduction region is not etched. As a result, it is possible to form an impurity introduction region and a positioning mark region that are aligned, based on a common insulating film pattern and without inviting a deterioration of the semiconductor device characteristics.

According to another embodiment it is preferable to include a step of forming, on the semiconductor substrate, a first insulating film with a thickness of at least 10 nanometer and at most 50 nanometer, and on forming, on the first insulating film, a second insulating film with a thickness of at least 100 nanometer and at most 200 nanometer; and a step of forming, on the second insulating film, a second photosensitive pattern with a thickness of about 3.0 microns and with an aperture at the impurity introduction region and an aperture at the positioning mark region; wherein in the impurity introduction step, the impurities are introduced through the aperture formed in the second photosensitive pattern and the aperture formed in the insulating film pattern at the impurity introduction region.

It is preferable further to include a step of removing the second photosensitive pattern after the impurity introduction step and before the first photosensitive pattern formation step.

It is preferable that in the impurity introduction step, boron is introduced by ion implantation into the impurity introduction region with an acceleration energy of about 900 kiloelectronvolts (keV).

It is preferable that the depth of the level difference formed in the level difference formation step is at least 80 nanometer and at most 120 nanometer.

It is preferable that the depth of the level difference formed in the level difference formation step is 100 nanometer.

A method for manufacturing a semiconductor device according to yet another aspect of the present embodiment includes a level difference formation step of forming, by thermal oxidation of the semiconductor substrate at the positioning mark region, a level difference for adjusting a position of the photomask at the apertures formed in the insulating film pattern; after the level difference formation step, an impurity introduction step of introducing the impurities through the apertures formed in the insulating film pattern at the impurity introduction region of the semiconductor substrate into the impurity introduction region. Therefore, it is possible to form an impurity introduction region and a positioning mark region that are aligned, based on a common insulating film pattern and without inviting a deterioration of the semiconductor device characteristics.

In yet another embodiment, it is preferable that in the level difference formation step, the thermal oxide film is formed by thermally oxidizing the surface of the semiconductor substrate.

It is preferable that the level difference formed in the level difference formation step is formed by lowering the interface between the thermal oxide film and the semiconductor substrate by about 55% of the film thickness of the oxide film.

It is preferable that the thickness of the thermal oxide film is about 50 nanometer, and the depth of the level difference is about 30 nanometer.

A method for manufacturing a semiconductor device according to yet another aspect of the present embodiment includes a level difference formation step of forming, by etching a first insulating film at a positioning mark region, a level difference for adjusting a position of the photomask at the apertures formed in the insulating film pattern; after the level difference formation step, an impurity introduction step of introducing the impurities through the apertures formed in the insulating film pattern at the impurity introduction region of the semiconductor substrate into the impurity introduction region. Therefore, it is possible to form an impurity introduction region and a positioning mark region that are aligned, based on a common insulating film pattern and without inviting a deterioration of the semiconductor device characteristics.

In yet another embodiment, it is preferable that the first insulating film formed in the first insulating film formation step is formed at a film thickness of at least 10 nanometer and at most 50 nanometer in the impurity introduction region, and at a film thickness of at least 300 nanometer and at most 500 nanometer in the positioning mark region.

It is preferable that the level difference formation step includes a step of etching away the first insulating film formed in the impurity introduction region.

It is preferable that the depth of the level difference formed in the positioning mark region in the level difference formation step is at least 50 nanometer.

It is preferable that the method further includes a step of forming a thermal oxide film covering the impurity introduction region after the level difference formation step and before the impurity introduction step.

It is preferable that the film thickness of the thermal oxide film is at least 5 nanometer and at most 20 nanometer.

A method for manufacturing a semiconductor device according to yet another aspect of the present embodiment includes a first photosensitive pattern formation step of forming, on the insulating film pattern, a first photosensitive pattern with an aperture that exposes the positioning mark region, the first photosensitive pattern covering a first impurity introduction region and a second impurity introduction region; and a level difference formation step of forming, at the positioning mark region, a level difference for adjusting the position of the photomask at the aperture formed in the insulating film pattern. Therefore, the first impurity introduction region and the second impurity introduction region covered by the first photosensitive pattern are not etched in order to form the level difference for adjusting the position of the photomask. Consequently, the first impurity introduction region and the second impurity introduction region are not etched. As a result, it is possible to form a first impurity introduction region, a second impurity introduction region and a positioning mark region that are aligned, based on a common insulating film pattern and without inviting a deterioration of the semiconductor device characteristics.

The following is a description of preferred embodiments of the present invention, with reference to the accompanying drawings.

Embodiment 1

FIGS. 1A to 1D and 2A to 2E are cross-sectional views illustrating a method for manufacturing a semiconductor device according to Embodiment 1.

As shown in FIG. 1A, first, a first insulating film 4 and a second insulating film 5 are formed in that order on a semiconductor substrate 6. The semiconductor substrate 6 may be a silicon substrate, for example. The first insulating film 4 may be a thermal oxide film, for example. The second insulating film 5 may be a silicon nitride film, for example. For the thermal oxide film and the silicon nitride film, it is possible to use the oxide film and the silicon nitride film that result when forming an inter-element field oxide film. The film thickness of the first insulating film 4 constituted by the thermal oxide film is at least about 10 nanometer (nm) and at most about 50 nanometer. The second insulating film 5 constituted by the silicon nitride film is formed by low-pressure CVD, and its film thickness is at least about 100 nanometer and at most about 200 nanometer.

Then, after applying a photosensitive material on the second insulating film 5, the photosensitive material is removed at the impurity introduction region 7 and the positioning mark region 8, forming a photosensitive pattern 3.

Figure 1B:
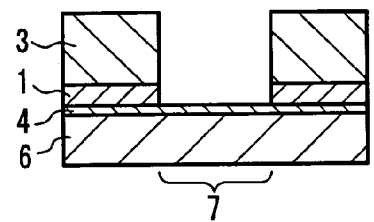

Next, as shown in FIG. 1B, the second insulating film 5 is etched away, taking the photosensitive pattern 3 as a mask, thus forming an insulating film pattern 1. It is preferable that this etching is dry-etching. For example, it may be dry-etching with $CHF_3$ gas. The second insulating film 5 is etched under such conditions that a sufficient selectivity of the etching speed of the second insulating film 5 over the etching speed of the first insulating film 4 is attained.

Figure 1C:
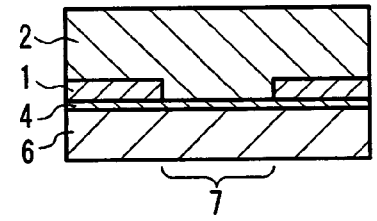

As shown in FIG. 1C, the photosensitive pattern 3 is removed by washing or the like. Then, after photosensitive material has been applied on the insulating film pattern 1, that photosensitive material is removed at a portion corresponding to the positioning mark region 8, thus forming a photosensitive pattern 2 covering the impurity introduction region 7. It is preferable that the aperture of the photosensitive pattern 2 in the positioning mark region 8 is formed so that it has the same size as the aperture of the insulating film pattern 1. However, since it is difficult to form both apertures in the same size, the aperture of the photosensitive pattern 2 is formed such that it is larger than the aperture of the insulating film pattern 1.

Figure 1D:
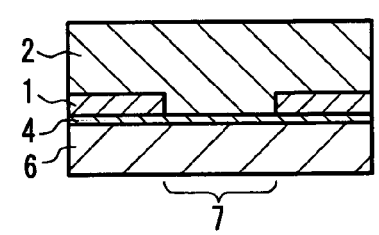

As shown in FIG. 1D, the first insulating film 4 is etched away by wet-etching with hydrofluoric acid, taking the insulating pattern 1 as a mask. It is also possible to etch away the first insulating film 4 by dry etching.

As shown in FIG. 2A, with the insulating film pattern 1 as a mask, the semiconductor substrate 6 is etched down by dry etching with a chlorine-based gas, forming a level difference 11 for a positioning mark. Since the impurity introduction region 7 is covered by the photosensitive pattern 2, there is no level difference formed by the dry etching.

Ordinarily, the positioning of photomasks based on positioning marks is performed with an LSA (laser search alignment) sensor having a helium (He)-neon (Ne) laser of 633 nanometer wavelength as the light source. In LSA, the diffraction light that is reflected by the level difference 11 for the positioning mark is detected. The signal intensity of the diffraction light depends on the interference conditions, that is, the silicon level difference, film thickness and refractive index. The diffraction light is subject to interference due to the silicon level difference, and the signal intensity has an amplitude due to phase differences, so that when the signal intensity of the diffraction light reflected by the level difference 11 for the positioning mark is weak, the photomask cannot be positioned.

Figure 3:
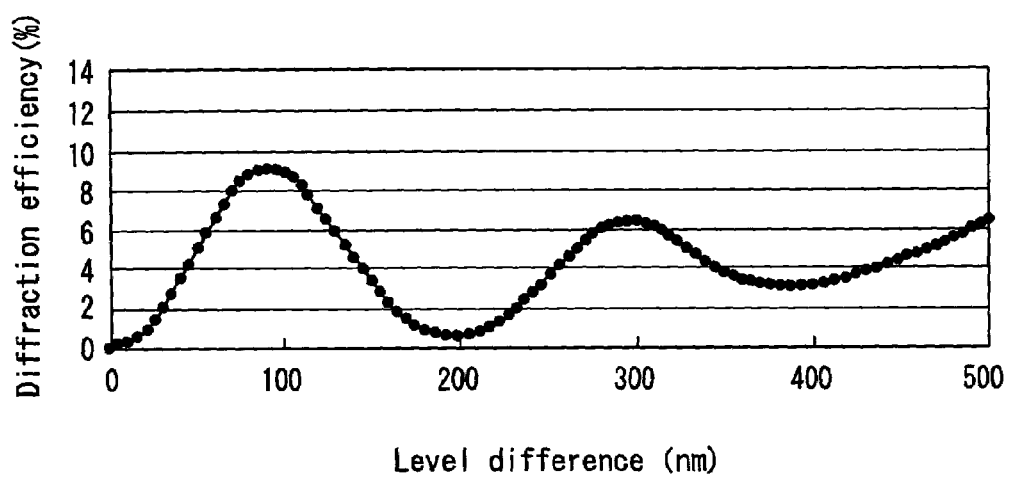
FIG. 3 is a graph showing the relation between the diffraction efficiency and the level difference formed by the method for manufacturing a semiconductor device according to Embodiment 1.

FIG. 3 is a graph showing the simulation results of the relation between the diffraction efficiency and the level difference for the positioning mark formed by the method for manufacturing a semiconductor device according to Embodiment 1. The horizontal axis denotes the depth of the level difference for the positioning mark formed in the semiconductor substrate 6, and the vertical axis denotes the diffraction efficiency of the diffraction light that is reflected by the level difference 11.

When the level difference is 100 nanometer (nm), the diffraction efficiency has its first peak. After that, the diffraction efficiency shows peaks at a period of 200 nanometer. The diffraction efficiency has peaks at a period of 200 nanometer starting from 100 nanometer, that is, at 100 nanometer, 300 nanometer, 500 nanometer and so on. The largest diffraction efficiency is attained for a level difference of 100 nanometer. Starting at a level difference of 200 nanometer and with a period of 200 nanometer, that is, at a level difference of 200 nanometer, 400 nanometer and so on, the diffraction light is weakened by interference, so that a high signal intensity is not attained. In particular, when the level difference is 200 nanometer, the diffraction efficiency of 2% that is necessary for positioning by the LSA sensor cannot be attained, so that the positioning of photomasks is not possible.

When variations of ±20% are considered for the silicon etching, then it is preferable that the depth of the level difference 11 for the positioning mark is at least 80 nanometer and at most 120 nanometer, and a depth of 100 nanometer is most preferable.

As shown in FIG. 2B, after the photosensitive pattern 2 has been removed by washing or the like, the first insulating film 4 is etched away at the impurity introduction region 7, with the insulating pattern 1 as a mask. For this etching process, wet etching is used. If the first insulating film 4 is removed by dry etching, then crystal defects may occur in the semiconductor substrate 6 due to plasma damage during etching, so that the semiconductor device characteristics may deteriorate due to leakage currents.

As shown in FIG. 2C, a thermal oxide film 13 of at least about 5 nanometer and at most about 20 nanometer thickness is formed by thermal oxidation, such that it covers the impurity introduction region 7 and the positioning mark region 8.

As shown in FIG. 2D, impurities 12 are introduced by ion implantation or the like from above the thermal oxide film 13 through the apertures in the insulating film pattern 1 into the impurity introduction region 7 and the positioning mark region 8. The introduced impurities 12 may be boron (B), $BF_2$, arsenic (As), phosphor (P) or Sb, for example. The ion implantation stopping power at this time depends on the sum of the film thickness of the first insulating film 4 and the film thickness of the second insulating film 5. In Embodiment 1, the thermal oxide film resulting when forming an inter-element separation field oxide film is used for the first insulating film 4, and the resulting silicon nitride film is used for the second insulating film 5, so that when the film thickness of the thermal oxide film is set to 50 nanometer and the film thickness of the silicon nitride film is set to 160 nanometer, for example, an acceleration energy of up to 35 kiloelectronvolts (keV) can be stopped when implanting boron ions, and an acceleration energy of up to 290 kiloelectronvolts (keV) can be stopped when implanting arsenic ions.

The thicker the first insulating film 4 and the second insulating film 5 are made, the higher their ion implantation stopping power is. For example, if the thickness of the silicon nitride film constituting the second insulating film 5 is set to about 1000 nanometer, then its stopping power will be up to an acceleration energy of 350 keV when implementing boron ions and up to an acceleration energy of 1500 keV when implementing arsenic ions.

As shown in FIG. 2E, the insulating film pattern 1 is etched away. This etching may be dry etching or wet etching. For wet etching, etching by phosphoric acid may be employed. Since the semiconductor substrate 6 is covered by the thermal oxide film 13, the semiconductor substrate 6 is not etched by the phosphoric acid.

Then, the first insulating film 4 is etched away. It is preferable that that this etching is wet etching. For this wet etching, hydrofluoric acid may be used. Thus, it is possible to attain the desired impurity introduction region 7 and the silicon level difference 11 of the positioning mark for the photomask.

As described above, it is possible to form the impurity introduction region 7 and the silicon level difference 11 of the positioning mark for the photomask with the same insulating film pattern 1. Thus, the impurity introduction region and the positioning marks are formed with self-alignment. Therefore, the positioning of photomasks for the formation of other impurity introduction regions or for the formation of gate electrodes in later steps can be carried out with direct reference to the impurity introduction region 7 via the positioning mark. Consequently, the overlaying precision is improved. As a result, the semiconductor device characteristics can be made more consistent.

In particular in solid-state imaging devices, the transfer channel region, the photodiode region and the separation region are formed by impurity introduction steps with photomasks, so that when the relative position of the impurity introduction regions changes, the solid-state imaging device characteristics deteriorate. For this reason, in the photomask overlaying steps, other overlaying steps must be carried out with the transfer channel region, the photodiode region and the separation region as the overlaid regions.

This aspect is also similar in bipolar transistors. In bipolar transistors, an emitter region has to be formed within a base region formed by a photomask overlaying step and an impurity introduction step. In this case, when the relative position of the emitter region to the base region changes, then the bipolar transistor characteristics deteriorate.

Consequently, Embodiment 1 is particularly advantageous for semiconductor devices in which the overlaying precision among different impurity regions is important, as in the above-mentioned solid-state imaging devices or bipolar transistors.

In Embodiment 1, the silicon level difference for the positioning mark is formed with a depth of at least 80 nanometer and at most 120 nanometer. If an LSA sensor is used whose light source is an He—Ne laser with a wavelength of 633 nanometer, then the largest diffraction efficiency is attained when the silicon level difference is 100 nanometer, as noted above. Even considering the variations of the etching when forming the silicon level difference, if the silicon level difference is at least 80 nanometer and at most 120 nanometer, then a sufficiently high diffraction efficiency can be attained. For this reason, the photomasks can be positioned reliably.

In Embodiment 1, an example was described in which the first insulating film 4 is made of a thermal oxide film, and the second insulating film 5 is made of a silicon nitride film. However, the present invention is not limited to this. It is sufficient if the first insulating film 4 and the second insulating film 5 are made of such materials that the etching speed of the first insulating film 4 is smaller than the etching speed of the second insulating film 5.

Moreover, in Embodiment 1, an example was described in which, after removing the first insulating film 4 by wet etching, the silicon substrate is dry-etched to form the level difference 11 for the positioning mark, but the present invention is not limited to this. It is also possible to perform dry etching to remove the first insulating film 4 and form the level difference 11 simultaneously.

Moreover, in Embodiment 1, an example was described in which impurities 12 are introduced by ion implantation from above the thermal oxide film 13 into the impurity introduction region 7, but it is also possible to introduce the impurities 12 into the impurity introduction region 7 by directly implanting ions from above the semiconductor substrate 6, without forming a thermal oxide film 13.

Embodiment 2

FIGS. 4A to 4D and 5A to 5D are cross-sectional views illustrating a method for manufacturing a semiconductor device according to Embodiment 2. The steps shown in FIGS. 4A and 4B are the same as the steps described with reference to FIGS. 1A and 1B in Embodiment 1.

As shown in FIG. 4A, first, a first insulating film 4 and a second insulating film 5 are formed in that order on a semiconductor substrate 6. The semiconductor substrate 6 may be a silicon substrate, for example. The first insulating film 4 may be a thermal oxide film, for example. The second insulating film 5 may be a silicon nitride film, for example. For the thermal oxide film and the silicon nitride film, it is possible to use the oxide film and the silicon nitride film that result when forming an inter-element field oxide film. The film thickness of the first insulating film 4 constituted by the thermal oxide film is at least about 10 nanometer (nm) and at most about 50 nanometer. The second insulating film 5 constituted by the silicon nitride film is formed by low-pressure CVD, and its film thickness is at least about 100 nanometer and at most about 200 nanometer.

Then, after applying a photosensitive material on the second insulating film 5, the photosensitive material is removed at the impurity introduction region 7 and the positioning mark region 8, forming a photosensitive pattern 3.

Next, as shown in FIG. 4B, the second insulating film 5 is etched away, with the photosensitive pattern 3 as a mask, thus forming an insulating film pattern 1. It is preferable that this etching is dry-etching. For example, it may be dry-etching with $CHF_3$ gas. The second insulating film 5 is etched under such conditions that a sufficient selectivity of the etching speed of the second insulating film 5 over the etching speed of the first insulating film 4 is attained.

As shown in FIG. 4C, impurities 12 are introduced by ion implementation from above the first insulating film 4 through the apertures in the photosensitive pattern 3 and the insulating film pattern 1 into the impurity introduction region 7 and the positioning mark region 8. The introduced impurities 12 may be boron (B), $BF_2$, arsenic (As), phosphor (P) or Sb, for example. The ion implantation stopping power depends on the sum of the film thickness of the first insulating film 4, the film thickness of the second insulating film 5 and the film thickness of the photosensitive pattern 3.

The film thickness of the photosensitive pattern 3, which depends on the viscosity of the photosensitive material and the rotation speed when applying the photosensitive material, can be formed considerably thicker than the film thickness of the first insulating film 4, which is formed by thermal oxidation, or the film thickness of the second insulating film 5, which is formed by low-pressure CVD. For this reason, the ion implantation stopping power is increased dramatically. For example, when the film thickness of the photosensitive pattern 3 is about 3.0 micron ($\mu$m), then it is possible to form deep diffusion layers by ion implantation with high acceleration energies of up to about 900 keV when implanting boron ions, or up to about 2200 keV when implanting arsenic (As) ions.

Next, as shown in FIG. 4D, the photosensitive pattern 3 is removed by washing or the like. Then, after photosensitive material has been applied on the insulating film pattern 1, that photosensitive material is removed at a portion corresponding to the positioning mark region 8, thus forming a photosensitive pattern 2 covering the impurity introduction region 7. It is preferable that the aperture of the photosensitive pattern 2 in the positioning mark region 8 is formed so that it has the same size as the aperture of the insulating film pattern 1. However, since it is difficult to form both apertures in the same size, the aperture of the photosensitive pattern 2 is formed such that it is larger than the aperture of the insulating film pattern 1.

As shown in FIG. 5A, the first insulating film 4 is etched away by wet-etching with hydrofluoric acid, taking the insulating pattern 1 as a mask. It is also possible to etch away the first insulating film 4 by dry etching.

As shown in FIG. 5B, with the insulating film pattern 1 as a mask, the semiconductor substrate 6 is etched down by dry etching with a chlorine-based gas, forming a level difference 11 for the positioning mark. Since the impurity introduction region 7 is covered by the photosensitive pattern 2, there is no level difference formed by the dry etching.

When variations of ±20% are considered for the silicon etching, then it is preferable that the depth of the level difference 11 for the positioning mark is at least 80 nanometer and at most 120 nanometer, and a depth of 100 nanometer is most preferable.

As shown in FIG. 5C, a thermal oxide film 13 of at least about 5 nanometer and at most about 20 nanometer thickness is formed by thermal oxidation, such that it covers the impurity introduction region 7 and the positioning mark region 8.

As shown in FIG. 5D, the insulating film pattern 1 is etched away. This etching may be dry etching or wet etching. For wet etching, etching by phosphoric acid may be employed. Since the semiconductor substrate 6 is covered by the thermal oxide film 13, the semiconductor substrate 6 is not etched by the phosphoric acid.

Then, the first insulating film 4 is etched away. It is preferable that that this etching is wet etching. For this wet etching, hydrofluoric acid may be used. Thus, it is possible to attain the desired impurity introduction region 7 and the silicon level difference 11 of the positioning mark for the photomask.

As described above, it is possible to form the impurity introduction region 7 and the silicon level difference 11 of the positioning mark for the photomask with the same insulating film pattern 1.

In this Embodiment 2, the film thickness of the photosensitivity pattern 3 can be used for the ion implantation stopping film thickness, in addition to the film thickness of the first insulating film 4 and the film thickness of the second insulating film 5, when forming the impurity introduction region. Therefore, the breadth of acceleration energies that can be used is increased, so that ions having a higher energy can be implanted. As a result, it is possible to form deeper impurity introduction regions.

Here, the impurity introduction region into which ions having a higher energy are introduced and the positioning mark are formed by self alignment. Therefore, the positioning of the photomask when forming other impurity introduction regions or gate electrodes in later steps can be carried out with direct reference to the impurity introduction region 7. Consequently, the overlaying precision is improved. As a result, the semiconductor device characteristics can be made more consistent.

In Embodiment 2, as in the foregoing Embodiment 1, the silicon level difference for the positioning mark is formed with a depth of at least 80 nanometer and at most 120 nanometer. If an LSA sensor is used whose light source is an He—Ne laser with a wavelength of 633 nanometer, then the largest diffraction efficiency is attained when the silicon level difference is 100 nanometer, as noted above. Even considering the variations of the etching when forming the silicon level difference, if the silicon level difference is at least 80 nanometer and at most 120 nanometer, then a sufficiently high diffraction efficiency can be attained. For this reason, the photomasks can be positioned reliably.

In Embodiment 2, as in the foregoing Embodiment 1, an example was described in which the first insulating film 4 is made of a thermal oxide film, and the second insulating film 5 is made of a silicon nitride film. However, the present invention is not limited to this. It is sufficient if the first insulating film 4 and the second insulating film 5 are made of such materials that the etching speed of the first insulating film 4 is smaller than the etching speed of the second insulating film 5.

Moreover, in Embodiment 2, as in the foregoing Embodiment 1, an example was described in which, after removing the first insulating film 4 by wet etching, the silicon substrate is dry-etched to form the level difference 11 for the positioning mark, but the present invention is not limited to this. It is also possible to perform dry etching to remove the first insulating film 4 and form the level difference 11 simultaneously.

Moreover, in Embodiment 2, as in the foregoing Embodiment 1, an example was described in which impurities 12 are introduced by ion implantation from above the thermal oxide film 13 into the impurity introduction region 7, but it is also possible to introduce the impurities 12 into the impurity introduction region 7 by directly implanting ions from above the semiconductor substrate 6, without forming a thermal oxide film 13.

Embodiment 3

FIGS. 6A to 6F are cross-sectional views illustrating a method for manufacturing a semiconductor device according to Embodiment 3. The steps shown in FIGS. 6A and 6B are the same as the steps described with reference to FIGS. 1A and 1B in Embodiment 1. Therefore, their explanation has been omitted.

In FIG. 6C, after the photosensitive pattern 3 has been removed by washing or the like, the first insulating film 4 at the positioning mark region 8 and the impurity introduction region 7 is etched away, with the insulating film pattern 1 as a mask. For this etching process, wet etching is used. If the first insulating film 4 is removed by dry etching, then crystal defects may occur in the semiconductor substrate 6 due to plasma damage during etching, so that the semiconductor device characteristics may deteriorate due to leak currents. For the wet etching, it is possible to use etching by hydrofluoric acid.

As shown in FIG. 6D, a thermal oxide film 13 is formed by thermal oxidation, such that it covers the impurity introduction region 7 and the positioning mark region 8. The semiconductor substrate 6 is oxidized, and the interface between the semiconductor substrate 6 and the thermal oxide film 13 is lowered below the surface of the semiconductor substrate 6. The resulting level difference 11C is used as the positioning mark for the photomask. The interface between the semiconductor substrate 6 and the thermal oxide film 13 is lowered by about 55% of the film thickness of the oxide film 13. For example, if the film thickness of the thermal oxide film 13 is 50 nanometer, then the depth of the level difference 11C is about 30 nanometer.

The positioning of the photomask is carried out by a LIA (laser interference alignment) sensor whose light source is an He—Ne laser with a wavelength of 633 nanometer. The LIA sensor performs the adjustment of the photomask by detecting the phase difference between the beat signals of the diffraction light and a reference signal, and if the depth of the level difference 11C is about 30 nanometer, then a sufficient phase difference can be detected by the LIA sensor.

As shown in FIG. 6E, impurities 12 are introduced by ion implementation from above the first thermal oxide film 13 through the apertures in the insulating film pattern 1 into the impurity introduction region 7 and the positioning mark region 8. The introduced impurities 12 may be boron (B), $BF_2$, arsenic (As), phosphor (P) or Sb, for example. The ion implantation stopping power at this time depends on the sum of the film thickness of the first insulating film 4 and the film thickness of the second insulating film 5.

As shown in FIG. 6F, the insulating film pattern 1 is etched away. This etching may be dry etching or wet etching. For wet etching, etching by phosphoric acid may be employed. Since the semiconductor substrate 6 is covered by the thermal oxide film 13, the semiconductor substrate 6 is not etched by the phosphoric acid.

Then, the first insulating film 4 is etched away. It is preferable that this etching is wet etching. For this wet etching, hydrofluoric acid may be used. Thus, it is possible to attain the desired impurity introduction region 7 and the silicon level difference 11C of the positioning mark for the photomask.

As described above, it is possible to form the impurity introduction region 7 and the silicon level difference 11C formed by thermal oxidation with the same insulating film pattern 1. Thus, the impurity introduction region and the positioning marks are formed with self-alignment. Therefore, the positioning of photomasks for the formation of other impurity introduction regions or for the formation of gate electrodes in later steps can be carried out with direct reference to the impurity introduction region 7. Consequently, the overlaying precision is improved. As a result, the semiconductor device characteristics can be made more consistent.

In Embodiment 3, an example was described in which the first insulating film 4 is formed as a thermal oxide film and the second insulating film 5 is formed as a silicon nitride film. However, the present invention is not limited to this. It is sufficient if the first insulating film 4 and the second insulating film 5 are made of such materials that the etching speed of the first insulating film 4 is smaller than the etching speed of the second insulating film 5.

Moreover, in Embodiment 3, an example was described in which the positioning of the photomask is carried out with a LIA sensor whose light source is a He—Ne laser with 633 nanometer wavelength, but the present invention is not limited to this. If the depth of the silicon level difference for the positioning mark is changed by adjusting the film thickness of the thermal oxide film, then it is possible to carry out the positioning of the photomask with any suitable sensor, such as an LSA (laser step alignment) or a FIA (field image alignment) sensor.

The above-described Embodiment 3 includes a level difference formation step of forming a level difference 11C for adjusting the position of the photomask at an aperture formed in the insulating film pattern 1 by thermal oxidation of the semiconductor substrate 6 at the positioning mark region 8, and, performed after the level difference formation step, an impurity introduction step of introducing impurities 12 into the impurity introduction region 7 through the aperture formed at the impurity introduction region 7 of the semiconductor substrate 6 in the insulating film pattern 1. Therefore, it is possible to form the impurity introduction region and the positioning mark region aligned with each other, with a common insulation film pattern, and without inviting deterioration of the semiconductor device characteristics.

Embodiment 4

FIGS. 7A to 7D and 8A to 8D are cross-sectional views illustrating a method for manufacturing a semiconductor device according to Embodiment 4.

Figure 7A:
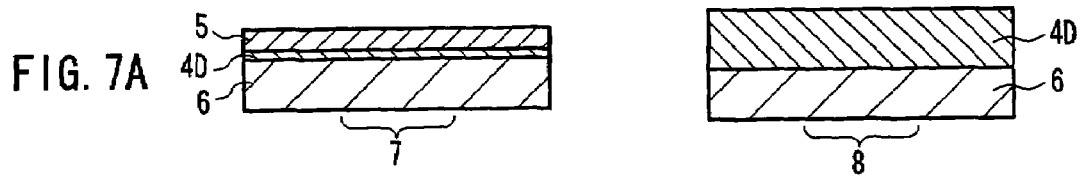
FIGS. 7A to 7D are cross-sectional views illustrating a method for manufacturing a semiconductor device according to Embodiment 4.

As shown in FIG. 7A, first, a first insulating film 4D and a second insulating film 5 are formed in that order on a semiconductor substrate 6. The first insulating film 4D may be a thermal oxide film, for example. The second insulating film 5 may be a silicon nitride film, for example. For the thermal oxide film and the silicon nitride film, it is possible to use the insulating film (oxide film and silicon nitride film) that results when forming an inter-element field oxide film. The film thickness of the first insulating film 4D constituted by the thermal oxide film is at least about 10 nanometer (nm) and at most about 50 nanometer in the impurity introduction region 7, and at least about 300 nm and at most about 500 nanometer in the positioning mark region 8.

The second insulating film 5 constituted by the silicon nitride film is formed by low-pressure CVID, and its film thickness is at least about 100 nanometer and at most about 200 nanometer.

Figure 7B:
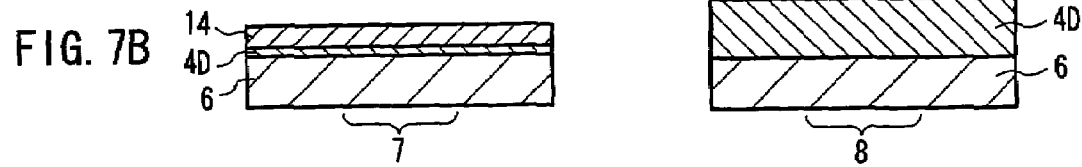

Next, as shown in FIG. 7B, the second insulating film 5 is etched away. It is preferable that this etching is wet-etching, and etching by phosphoric acid may be employed, for example. Then, a third insulating film 14 made of a silicon nitride film is formed by low-pressure CVD on the first insulating film 4D at a thickness of at least about 100 nanometer and at most about 200 nanometer on the first insulating film 4D.

Figure 7C:
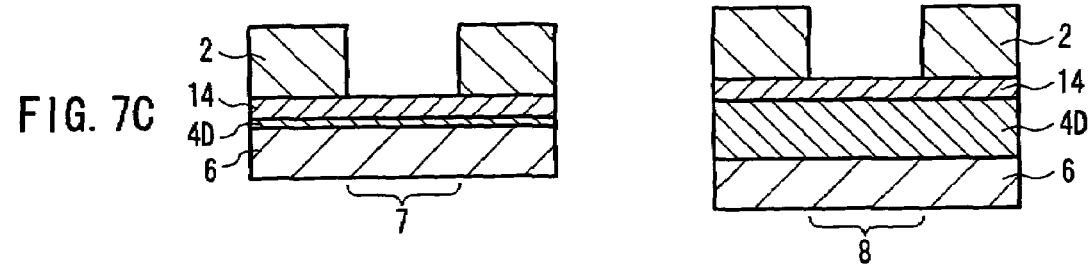

As shown in FIG. 7C, after a photosensitive material is applied on the third insulating film 14, a photosensitive pattern 2 is formed with apertures at the portions corresponding to the impurity introduction region 7 and the positioning mark region 8.

Figure 7D:
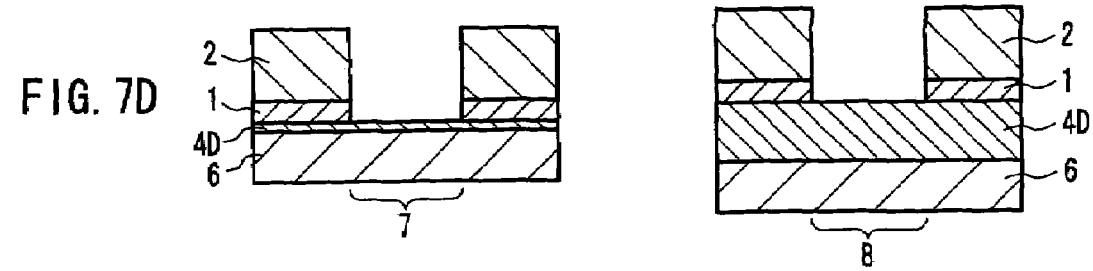

As shown in FIG. 7D, the third insulating film 14 is etched away, with the photosensitive pattern 2 as a mask, thus forming an insulating film pattern 1. For this etching, dry etching is preferable, for example dry etching by $CHF_3$ gas. The second insulating film 5 is etched under such conditions that a sufficient selectivity of the etching speed of the second insulating film 5 over the etching speed of the first insulating film 4 is attained.

As shown in FIG. 8A, the photosensitive pattern 2 is removed by washing or the like. Then, by etching the first insulating film 4D with the insulating film pattern 1 as a mask, a level difference 11D for the positioning mark is formed. For this etching, wet etching is preferable, for example etching by hydrofluoric acid. The etched amount is set such that the first insulating film 4D in the impurity region 7 can be sufficiently eliminated, and that the depth of the level difference 11D at the positioning mark region 8 is formed to at least 50 nanometer.

The positioning of the photomask based on the positioning mark is carried out with an LSA sensor whose light source is a helium (He)-neon (Ne) laser with 633 nanometer wavelength. If the depth of the level difference 11D is at least 50 nanometer, then it can be used adequately as a positioning mark for photomasks with an LSA sensor.

As shown in FIG. 8B, a thermal oxide film 13 of at least about 5 nanometer and at most about 20 nanometer thickness is formed by thermal oxidation, such that it covers the impurity introduction region 7 and the positioning mark region 8.

As shown in FIG. 8C, impurities 12 are introduced by ion implantation or the like from above the thermal oxide film 13 through the apertures in the insulating film pattern 1 into the impurity introduction region 7 and the positioning mark region 8. The introduced impurities 12 may be boron (B), $BF_2$, arsenic (As), phosphor (P) or Sb, for example. The ion implantation stopping power at this time depends on the sum of the film thickness of the first insulating film 4D and the film thickness of the second insulating film 5.

As shown in FIG. 8D, the insulating film pattern 1 is etched away. This etching may be dry etching or wet etching. For wet etching, etching by phosphoric acid may be employed. Since the semiconductor substrate 6 is covered by the thermal oxide film 13, the semiconductor substrate 6 is not etched by the phosphoric acid.

Thus, it is possible to obtain the desired impurity introduction region 7 and silicon level difference 11D of the positioning mark for the photomask.

As described above, it is possible to form the impurity introduction region 7 and the oxide film level difference 11D of the positioning mark for the photomask with the same insulating film pattern 1. Thus, the impurity introduction region and the positioning mark are formed with self-alignment. Therefore, the positioning of photomasks for the formation of other impurity introduction regions or for the formation of gate electrodes in later steps can be carried out with direct reference to the impurity introduction region 7. Consequently, the overlaying precision is improved. As a result, the semiconductor device characteristics can be made more consistent.

In Embodiment 4, an example was shown in which the positioning of the photomask is carried out with a LSA sensor whose light source is a He—Ne laser with 633 nanometer wavelength, but the present invention is not limited to this. If the depth of the oxide film level difference for the positioning mark is changed by adjusting the etching amount of the thermal oxide film, then it is possible to carry out the positioning of the photomask with any suitable sensor, such as a LIA (laser interference alignment) or a FIA (field image alignment) sensor.

Moreover, in Embodiment 4, an example was described in which impurities 12 are introduced by ion implantation from above the thermal oxide film 13 into the impurity introduction region 7, but it is also possible to introduce the impurities 12 into the impurity introduction region 7 by directly implanting ions from above the semiconductor substrate 6, without forming the thermal oxide film 13.

In Embodiment 4, an example was described in which the first insulating film 4D is made of a thermal oxide film, and the third insulating film 14 is made of a silicon nitride film. However, the present invention is not limited to this. It is sufficient if the first insulating film 4D and the third insulating film 14 are made of such materials that the etching speed of the first insulating film 4D is smaller than the etching speed of the third insulating film 14.

The above-described Embodiment 4 includes a level difference formation step of forming a level difference 11D for adjusting the position of the photomask at an aperture formed in the insulating film pattern 1 by etching the first insulating film 4D in the positioning mark region 8, and, after the level difference formation step, performing an impurity introduction step of introducing impurities 12 into the impurity introduction region 7 through apertures formed at the impurity introduction region 7 of the semiconductor substrate 6 in the insulating film pattern 1. Therefore, it is possible to form the impurity introduction region 7 and the positioning mark region 8 aligned with each other, with a common insulation film pattern 1, and without inviting deterioration of the semiconductor device characteristics.

Embodiment 5

FIGS. 9A to 9E and 10A to 10E are cross-sectional views illustrating a method for manufacturing a semiconductor device according to Embodiment 5.

Figure 9A:
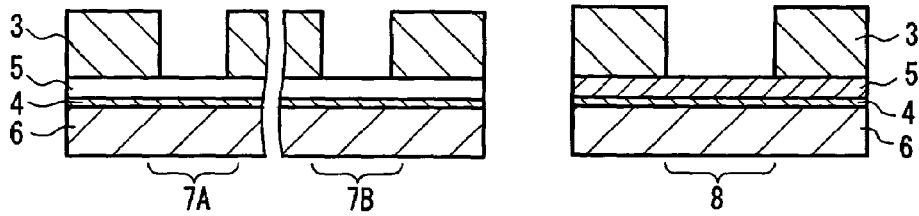
FIGS. 9A to 9D are cross-sectional views illustrating a method for manufacturing a semiconductor device according to Embodiment 5.

As shown in FIG. 9A, first, a first insulating film 4 and a second insulating film 5 are formed in that order on a semiconductor substrate 6. The first insulating film 4 may be a thermal oxide film, for example. The second insulating film 5 may be a silicon nitride film, for example. For the thermal oxide film and the silicon nitride film, it is possible to use the insulating films (oxide film and silicon nitride film) that result when forming an inter-element field oxide film, for example. The film thickness of the first insulating film 4 constituted by the thermal oxide film is at least about 10 nanometer (nm) and at most about 50 nanometer. The second insulating film 5 constituted by the silicon nitride film is formed by low-pressure CVD, and its film thickness is at least about 100 nanometer and at most about 200 nanometer.

Then, after applying a photosensitive material on the second insulating film 5, the photosensitive material is removed at a first impurity introduction region 7A, a second impurity introduction region 7B and a positioning mark region 8, forming a photosensitive pattern 3.

Figure 9B:
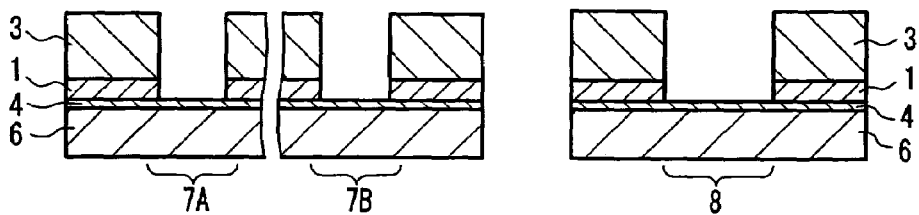

Next, as shown in FIG. 9B, the second insulating film 5 is etched away, using the photosensitive pattern 3 as a mask, thus forming an insulating film pattern 1. It is preferable that this etching is dry-etching. For example, it may be dry-etching with $CHF_3$ gas. The second insulating film 5 is etched under such conditions that a sufficient selectivity of the etching speed of the second insulating film 5 over the etching speed of the first insulating film 4 is attained.

Figure 9C:
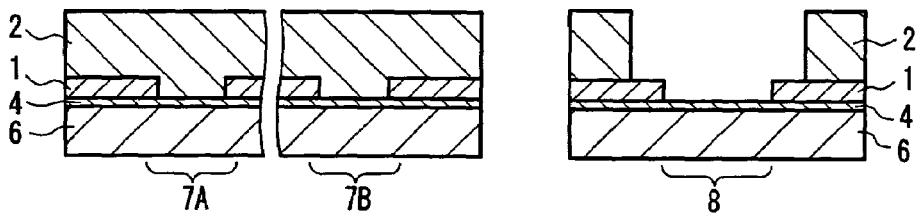

As shown in FIG. 9C, the photosensitive pattern 3 is removed by washing or the like. Then, after photosensitive material has been applied on the insulating film pattern 1, that photosensitive material is removed in a portion corresponding to the positioning mark region 8, thus forming a photosensitive pattern 2 covering the first impurity introduction region 7A and the second impurity introduction region 7B. It is preferable that the aperture of the photosensitive pattern 2 in the positioning mark region 8 is formed so that it has the same size as the aperture of the insulating film pattern 1. However, since it is difficult to form both apertures in the same size, the aperture of the photosensitive pattern 2 is formed such that it is larger than the aperture of the insulating film pattern 1.

Figure 9D:
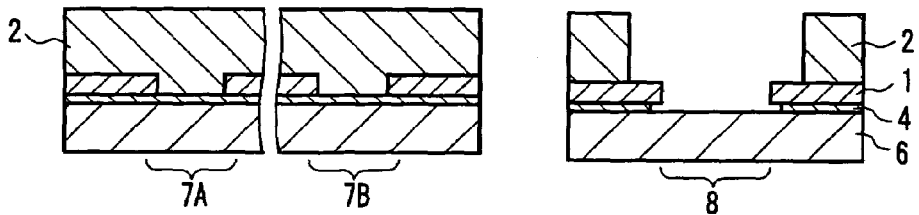

As shown in FIG. 9D, the first insulating film 4 is etched away by wet-etching with hydrofluoric acid, using the insulating film pattern 1 as a mask. It is also possible to etch away the first insulating film 4 by dry etching.

Figure 9E:
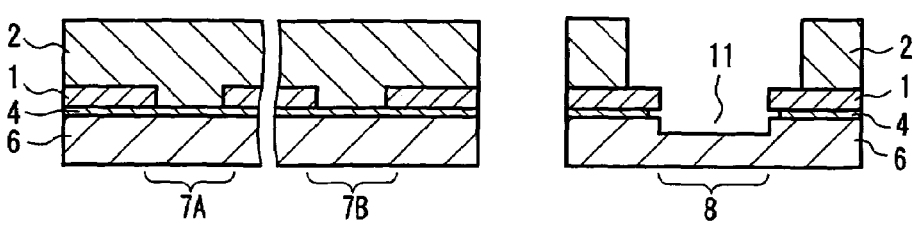
Figure 11A:
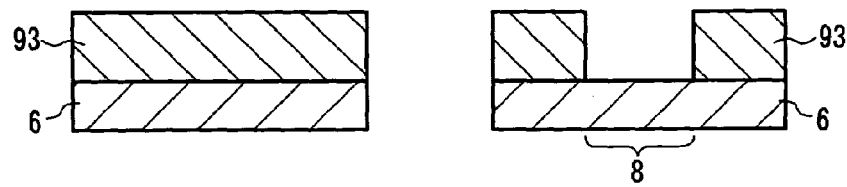
FIGS. 11A to 11D are cross-sectional views illustrating a conventional method for manufacturing a semiconductor device.
Figure 11B:
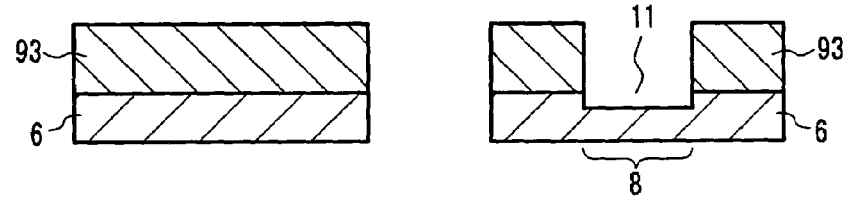
Figure 11C:
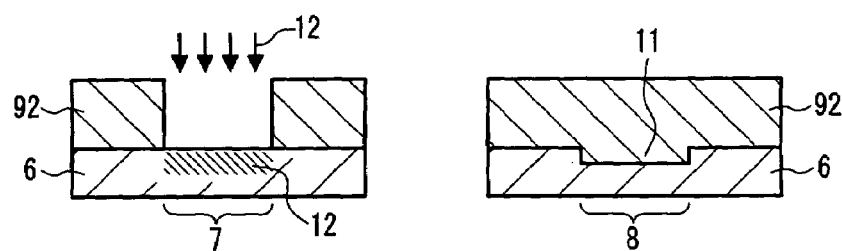
Figure 11D:
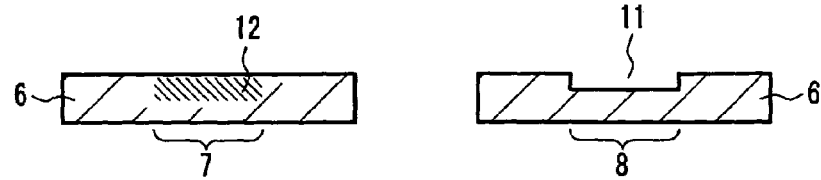
Figure 12A:
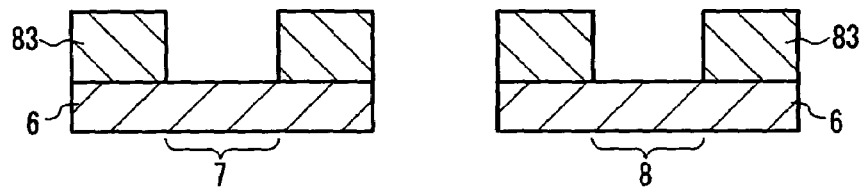
FIGS. 12A to 12D are cross-sectional views illustrating the another conventional method for manufacturing a semiconductor device.
Figure 12B:
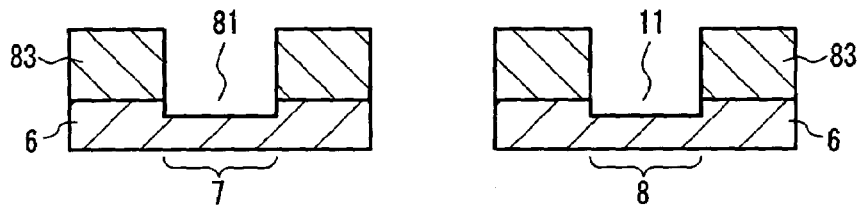
Figure 12C:
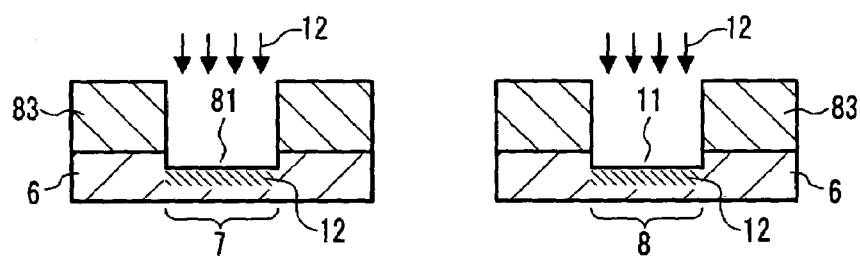
Figure 12D:
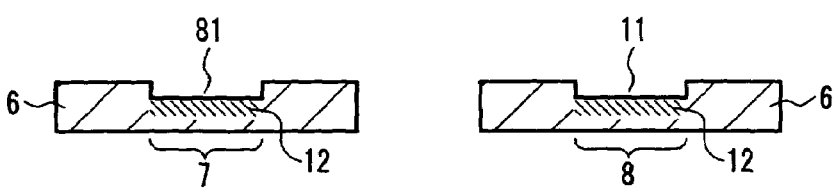
Figure 13A:
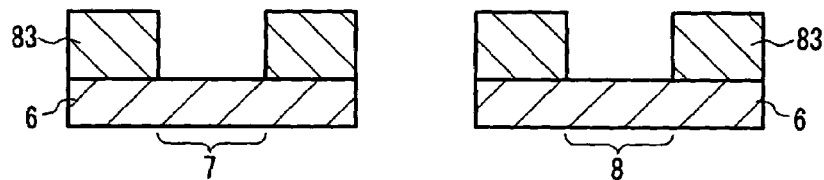
FIGS. 13A to 13D are cross-sectional views illustrating still another conventional method for manufacturing a semiconductor device.
Figure 13B:
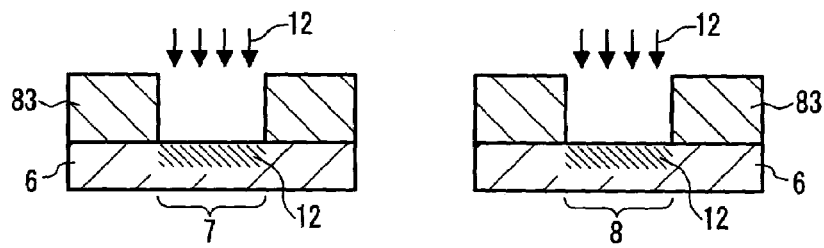
Figure 13C:
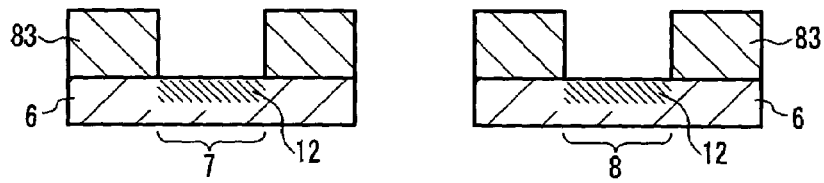
Figure 13D:
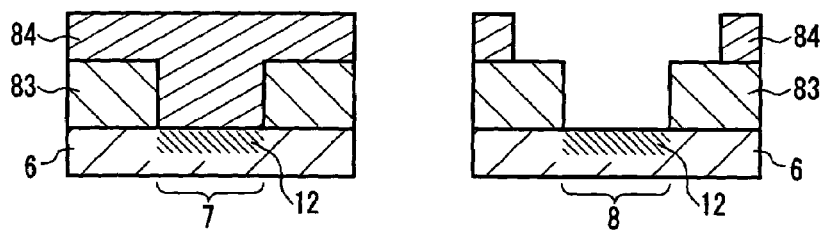

As shown in FIG. 9E, with the insulating film pattern 1 as a mask, the semiconductor substrate 6 is etched down by dry etching with a chlorine-based gas, forming a level difference 11 for the positioning mark. Since the first impurity introduction region 7A and the second impurity introduction region 7B are covered by the photosensitive pattern 2, there is no level difference formed by the dry etching.

In Embodiment 5, as in the previously described Embodiment 1, the silicon level difference 11 for the positioning mark is formed with a depth of at least 80 nanometer and at most 120 nanometer. If an LSA sensor is used whose light source is an He—Ne laser with a wavelength of 633 nanometer, then the largest diffraction efficiency is attained when the above-noted silicon level difference is 100 nanometer, as explained above. Even considering the variations of the etching for forming the silicon level difference, if the silicon level difference is at least 80 nanometer and at most 120 nanometer, then a sufficiently high diffraction efficiency can be attained. For this reason, photomasks can be positioned reliably.

As shown in FIG. 10A, after the photosensitive pattern 2 has been removed by washing or the like, the first insulating film 4 is etched away at the impurity introduction regions 7A, 7B, with the insulating pattern 1 as a mask. For this etching process, wet etching is used. If the first insulating film 4 is removed by dry etching, then crystal defects may occur in the semiconductor substrate 6 due to plasma damage during etching, so that the semiconductor device characteristics may deteriorate due to leakage currents.

As shown in FIG. 10B, a thermal oxide film 13 of at least about 5 nanometer and at most about 20 nanometer thickness is formed by thermal oxidation, such that it covers the impurity introduction regions 7 and the positioning mark region 8.

As shown in FIG. 10C, a photosensitive pattern 2A with an aperture at the portion corresponding to the first impurity introduction region 7A is formed on the insulating film pattern 1 such that it covers the second impurity introduction region 7B and the positioning mark region 8. Then, first impurities 12A are introduced from above the thermal oxide film 13 through the aperture in the insulating film pattern 1 into the first impurity introduction region 7A.

As shown in FIG. 10D, the photosensitive pattern 2A is removed by washing or the like. Next, a photosensitive pattern 2B with an aperture at the portion corresponding to the second impurity introduction region 7B is formed on the insulating film pattern 1 such that it covers the first impurity introduction region 7A and the positioning mark region 8. Then, second impurities 12B are introduced from above the thermal oxide film 13 through the aperture in the insulating film pattern 1 into the second impurity introduction region 7B.

As shown in FIG. 10E, the photosensitive pattern 2B is removed by washing or the like. Then, the insulating film pattern 1 is etched away. This etching may be dry etching or wet etching. For wet etching, etching by phosphoric acid may be employed. Since the semiconductor substrate 6 is covered by the thermal oxide film 13, the semiconductor substrate 6 is not etched by the phosphoric acid.

Then, the first insulating film 4 is etched away. It is preferable that that this etching is wet etching. For this wet etching, hydrofluoric acid may be used. Thus, it is possible to attain the desired impurity introduction regions 7A, 7B and the silicon level difference 11 of the positioning mark for the photomask.

As described above, it is possible to form the first impurity introduction region 7A, the second impurity introduction region 7B and the silicon level difference 11 of the positioning mark for the photomask with the same insulating film pattern 1. Thus, the first and second impurity introduction regions and the positioning mark are formed with self-alignment. Therefore, the positioning of photomasks for the formation of other impurity introduction regions or for the formation of gate electrodes in later steps can be carried out with direct reference to the first and second impurity introduction regions. Consequently, the overlaying precision is improved. As a result, the semiconductor device characteristics can be made more consistent.

In Embodiment 5, an example was shown in which two types of impurity introduction regions and the positioning mark have been formed with self-alignment, but it is also possible to form three or more types of impurity introduction regions and the positioning mark with self-alignment.

With the above-described embodiments of the invention, it is possible to provide a method for manufacturing a semiconductor device with which an impurity introduction region and a positioning mark region can be formed that are aligned to one another, based on a common insulating film pattern and without inviting deterioration of the semiconductor device characteristics.

The invention may be embodied in other specific forms without departing from the spirit or essential characteristics thereof The embodiments disclosed in this application are to be considered in all respects as illustrative and not restrictive, the scope of the invention being indicated by the appended claims rather than by the foregoing description. All changes that come within the meaning and range of equivalency of the claims are intended to be embraced therein.

The invention claimed is:

1. A method for manufacturing a semiconductor device, comprising:

an insulating film pattern formation step of forming, on a semiconductor substrate, an insulating film pattern with an aperture at an impurity introduction region for introducing impurities into the semiconductor substrate and an aperture at a positioning mark region for adjusting a position of a photomask with respect to the semiconductor substrate;

a first photosensitive pattern formation step of forming, on the insulating film pattern, a first photosensitive pattern with an aperture that exposes the positioning mark region, the first photosensitive pattern covering the impurity introduction region;

a level difference formation step of forming, at the positioning mark region in the semiconductor substrate, a level difference for adjusting the position of the photomask at the aperture formed in the insulating film pattern;

after the level difference formation step, a first photosensitive pattern removal step of removing the first photosensitive pattern; and after the first photosensitive pattern removal step, an impurity introduction step of introducing the impurities through the aperture formed in the insulating film pattern into the impurity introduction region.

2. The method for manufacturing a semiconductor device according to claim 1, wherein the insulating film pattern formation step comprises:

a step of forming a first insulating film and a second insulating film, in that order, on the semiconductor substrate;

a step of forming, on the second insulating film, a second photosensitive pattern having apertures at the impurity introduction region and the positioning mark region; and a step of forming the insulating film pattern by etching the second insulating film with the second photosensitive pattern as a mask.

3. A method for manufacturing a semiconductor device, comprising:

an insulating film pattern formation step of forming, on a semiconductor substrate, an insulating film pattern with an aperture at an impurity introduction region for introducing impurities into the semiconductor substrate and an aperture at a positioning mark region for adjusting a position of a photomask with respect to the semiconductor substrate;

an impurity introduction step of introducing the impurities through the apertures formed in the insulating film pattern into the impurity introduction region;

after the impurity introduction step, a first photosensitive pattern formation step of forming, on the insulating film pattern, a first photosensitive pattern with an aperture that exposes the positioning mark region, the first photosensitive pattern covering the impurity introduction region;

after the first photosensitive pattern formation step, a level difference formation step of forming, at the positioning mark region in the semiconductor substrate, a level difference for adjusting a position of the photomask at the aperture formed in the insulating film pattern; and after the level difference formation step, a first photosensitive pattern removal step of removing the first photosensitive pattern.

4. A method for manufacturing a semiconductor device, comprising:

an insulating film pattern formation step of forming, on a semiconductor substrate, an insulating film pattern with an aperture at an impurity introduction region for introducing impurities into the semiconductor substrate and an aperture at a positioning mark region for adjusting a position of a photomask with respect to the semiconductor substrate;

a level difference formation step of forming, by thermal oxidation of the semiconductor substrate at the positioning mark region, a level difference for adjusting a position of the photomask at the apertures formed in the insulating film pattern;

after the level difference formation step, an impurity introduction step of introducing the impurities through the apertures formed in the insulating film pattern into the impurity introduction region.

5. A method for manufacturing a semiconductor device, comprising:

an inter-element separation field oxide film forming step of forming an inter-element separation field oxide film in a predetermined region of a semiconductor substrate;

an insulating film pattern formation step of forming, on the semiconductor substrate and the inter-element separation field oxide film, an insulating film pattern with an aperture at an impurity introduction region for introducing impurities into the semiconductor substrate and an aperture at a positioning mark region for adjusting a position of a photomask with respect to the semiconductor substrate;

a level difference formation step of forming, at the positioning mark region in the inter-element separation field oxide film, a level difference for adjusting a position of the photomask at the apertures formed in the insulating film pattern; and an impurity introduction step of introducing the impurities through the apertures formed in the insulating film pattern into the impurity introduction region.

* * * * *